(12) United States Patent
Zheng et al.

(10) Patent No.: US 9,583,059 B2
(45) Date of Patent: Feb. 28, 2017

(54) LEVEL SHIFT CIRCUIT, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Liangliang Zheng, Beijing (CN); Jian He, Beijing (CN); Tingting Jin, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 58 days.

(21) Appl. No.: 14/422,340

(22) PCT Filed: May 29, 2014

(86) PCT No.: PCT/CN2014/078762
§ 371 (c)(1),
(2) Date: Feb. 18, 2015

(87) PCT Pub. No.: WO2015/051643
PCT Pub. Date: Apr. 16, 2015

(65) Prior Publication Data
US 2016/0012790 A1    Jan. 14, 2016

(30) Foreign Application Priority Data

Oct. 12, 2013    (CN) .......................... 2013 1 0477497

(51) Int. Cl.
*G09G 3/36*    (2006.01)
*H03K 3/356*    (2006.01)

(52) U.S. Cl.
CPC ......... *G09G 3/3648* (2013.01); *G09G 3/3688* (2013.01); *H03K 3/35613* (2013.01);
(Continued)

(58) Field of Classification Search
CPC ............... G09G 3/3688; G09G 3/3648; G09G 2310/0289; G09G 2330/06;
(Continued)

(56) References Cited

U.S. PATENT DOCUMENTS 6,580,411 B1    6/2003  Kubota et al.
2006/0028245 A1*    2/2006  Min ................. H03K 3/356113
                                            326/81

(Continued)

FOREIGN PATENT DOCUMENTS

CN        1564462 A        1/2005
CN        1734942 A        2/2006
(Continued)

OTHER PUBLICATIONS

Chinese Office Action dated Apr. 14, 2015 issued in corresponding Chinese Application No. 201310477497.1.
(Continued)

*Primary Examiner* — Premal Patel
(74) *Attorney, Agent, or Firm* — Nath, Goldberg & Meyer; Joshua B. Goldberg (57) ABSTRACT

The present invention provides a level shift circuit, an array substrate and a display device. The level shift circuit comprising: a first level non-inverting input terminal, a first level inverting input terminal, a second level non-inverting input terminal, a second level inverting input terminal, a level state transferring unit and a second level driving unit; the level state transferring unit receives a first level input through the first level non-inverting input terminal and the first level inverting input terminal, and transfers a high and
(Continued)

low state of the input first level to the second level driving unit; the second level driving unit outputs a second level of a corresponding state to the second level non-inverting input terminal and the second level inverting input terminal according to the input high and low state, wherein the first level is not equal to the second level.

14 Claims, 4 Drawing Sheets

(52) U.S. Cl.
CPC ........... *G09G 2300/0408* (2013.01); *G09G 2300/0871* (2013.01); *G09G 2310/0286* (2013.01); *G09G 2310/0289* (2013.01); *G09G 2330/06* (2013.01)

(58) Field of Classification Search
CPC ... G09G 2310/0286; G09G 2300/0408; G09G 2300/0871; H03K 3/35613
See application file for complete search history.

(56) References Cited

U.S. PATENT DOCUMENTS

| 2010/0123505 A1 | 5/2010 | Chou et al. |
| 2011/0032237 A1 | 2/2011 | Lin |

FOREIGN PATENT DOCUMENTS

| CN | 101488742 A | 7/2009 |
| CN | 101996547 A | 3/2011 |
| CN | 103489425 A | 1/2014 |
| JP | 11-272240 A | 10/1999 |
| JP | 2004153524 A | 5/2004 |
| JP | 3578740 B2 | 10/2004 |

OTHER PUBLICATIONS

Written Opinion dated Aug. 27, 2014 issued in corresponding International Application No. PCT/CN2014/078762.
International Search Report for International Application No. PCT/CN2014/078762.

\* cited by examiner

Fig. 1

(Prior Art)

Fig. 2

(Prior Art)

LEVEL SHIFT CIRCUIT, ARRAY SUBSTRATE AND DISPLAY DEVICE

This is a National Phase Application filed under 35 U.S.C. 371 as a national stage of PCT/CN2014/078762, filed May 29, 2014, an application claiming the benefit of Chinese Application No. 201310477497.1, filed Oct. 12, 2013, the content of each of which is hereby incorporated by reference in its entirety.

FIELD OF THE INVENTION

The present invention relates to the field of display technology, and particularly to a level shift circuit, an array substrate and a display device.

BACKGROUND OF THE INVENTION

Flat panel displays such as liquid crystal displays, plasma displays, OLED (organic light-emitting diode) displays and the like, due to their advantages of high quality, small volume, light weight, wide range of applications and the like, are widely used in consumer electronics such as mobile phones, notebook computers, displays, televisions and the like, and have gradually been replacing traditional cathode ray tube displays and become the mainstream of the displays.

Figure 1:
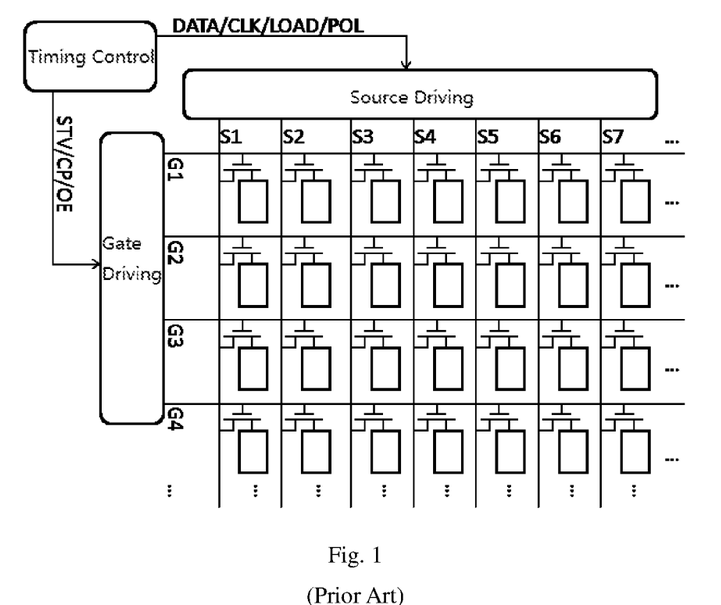
FIG. 1 is a schematic diagram of a driving structure for a liquid crystal panel in the prior art.
Figure 2:
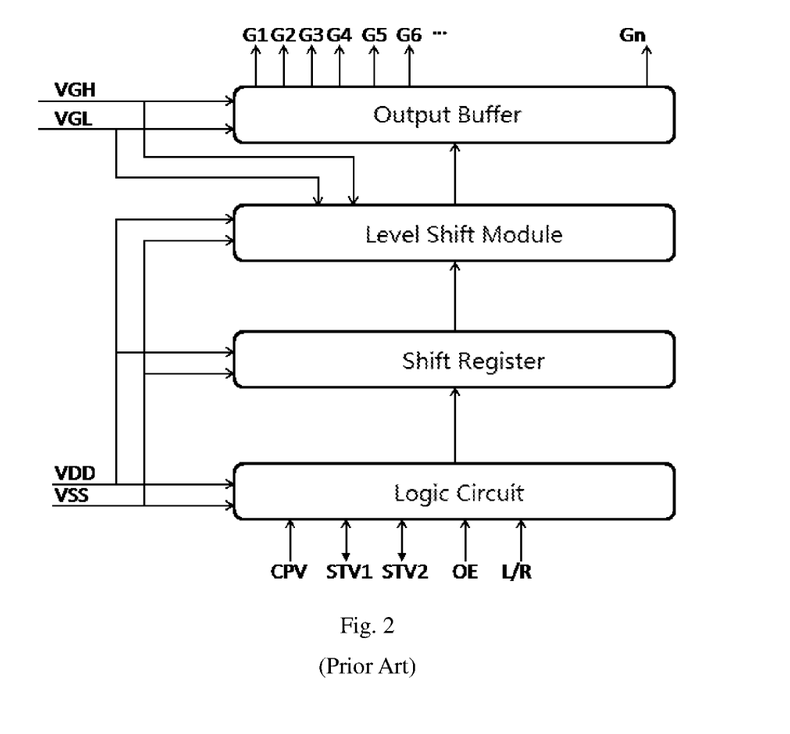
FIG. 2 is a schematic diagram of an internal structure of a gate driving chip in the prior art, in which a level shift module is integrated inside the gate driving chip.

As shown in FIG. 1, in a driving structure for a traditional display panel such as a liquid crystal panel, a timing control (T-CON) chip supplies signals such as data signal (DATA), clock signal (CLK), load signal (LOAD), polarity signal (POL) and the like to a source driving chip so as to generate charging signals applied to data lines connected to thin film transistors (TFTs), and supplies start pulse vertical signal (STV), clock pulse vertical signal (CPV) and output enable signal (OE) to a gate driving chip so as to control ON and OFF of the TFTs in respective pixel circuits. An internal structure of the gate driving chip is as shown in FIG. 2, a logic circuit, according to the start pulse vertical signals (STVs, such as STV1 and STV2), the clock pulse vertical signal (CPV), the output enable signal (OE), left or right shift indicating signal (L/R) and the like, controls a shift register to sequentially output gating signals for the gate lines, and the output signals of the shift register are output to the gate lines (G1, G2, . . . Gn) row by row via an output buffer after being enhanced by a level shift module (integrated in the gate driving chip in a form of an IC), thus sequentially gating/scanning the gate lines.

Figure 3:
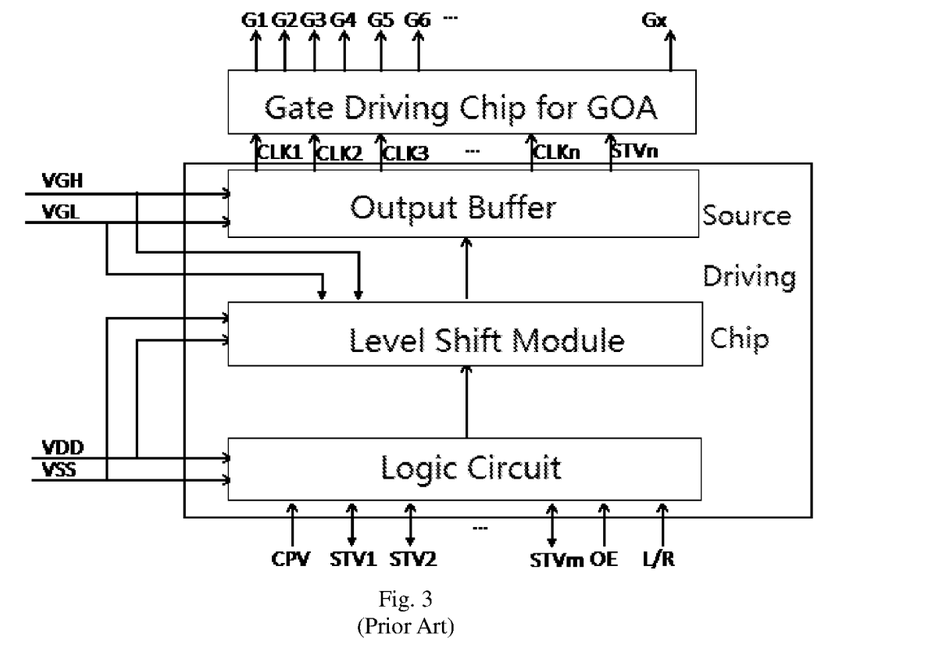
FIG. 3 is a schematic diagram (only a source driving chip and a gate driving chip are shown) of a driving structure of a GOA panel in the prior art, in which a gate driving chip is provided on an array substrate of a display panel.

GOA (Gate On Array, a gate driver integrated on an array substrate) technique is one of the gate driving techniques for display panels (e.g., liquid crystal panels), and basic concept thereof is that a gate driving circuit of a liquid crystal panel is integrated on an array substrate to scan and drive the liquid crystal panel. Compared to a conventional driving technique, the GOA technique not only omits a bonding area for the gate driving circuit and a fan-out wiring space, but also achieves a narrow frame design, thus an artistic design symmetrical on both sides can be implemented. FIG. 3 illustrates a gate driving structure of a GOA in the prior art. In this solution, since a level shift module is designed to be inside a source driving chip (i.e. is integrated in the source driving chip in a form of an IC module rather than a TFT structure), it is necessary for the source driving chip to adopt a high voltage manufacturing process; in addition, the T-CON chip is integrated into the same chip as the source driving chip (i.e., the T-CON chip and the source driving chip are the same chip), and comprises a timing circuit for the gate driving circuit, which also makes it necessary to adopt a high voltage manufacturing process for the source driving chip, thus resulting in increased design cost. In addition, limited by the manufacturing process of the chip, |VGH|+|VGL| in source driving signals cannot be too high, and accordingly, a voltage for turning on a TFT output to a GOA unit is relatively low, which results in a problem that the GOA unit cannot be fully turned on or cannot even be started at a low temperature, and further leads to insufficient charging or even a failure to charge. In addition, in the prior art, there is also a GOA driving structure adopting an external level shift chip. In this structure, since signals, such as STV, CLKn and the like, output to the GOA by the external level shift module are of relatively high levels and relatively high frequencies, an anti-electromagnetic interference device cannot be provided between the level shift module and the panel, thus the risk of electromagnetic interference is extremely high, and this design may also result in increased design cost for a panel manufacturer.

SUMMARY OF THE INVENTION

1. Technical Problem to be Solved

A technical problem to be solved by the present invention is providing a level shift circuit, an array substrate and a display device, which can avoid the problems that design cost is increased and a GOA unit cannot be started at a low temperature when the level shift circuit is integrated inside a source driving chip.

2. Technical Solutions

To solve the above problem, the present invention provides a level shift circuit, which comprises: a first level non-inverting input terminal, a first level inverting input terminal, a second level non-inverting output terminal, a second level inverting output terminal, a level state transferring unit and a second level driving unit;

the level state transferring unit receives a first level input through the first level non-inverting input terminal and the first level inverting input terminal, and transfers a state of the input first level to the second level driving unit; the second level driving unit outputs a second level of a corresponding state to the second level non-inverting output terminal and the second level inverting output terminal according to the input state of the first level, wherein the first level is not equal to the second level.

The level state transferring unit comprises:

a first signal non-inverting input unit, which is configured to receive a non-inverted level signal input through the first level non-inverting input terminal and output a level signal having the same phase;

a first signal inverting input unit, which is configured to receive an inverted level signal input through the first level inverting input terminal and output a level signal having the same phase; and a first state interlocking unit, which is configured to receive the level signals output from the first signal non-inverting input unit and the first signal inverting input unit, maintain states of the level signals unchanged through an interlocking structure, and output the level signals in forms of a non-inverted level signal and an inverted level signal, respectively.

The second level driving unit comprises:

a second signal non-inverting input unit, which is configured to receive the non-inverted level signal output by the first state interlocking unit and output a level signal having the same phase;

a second signal inverting input unit, which is configured to receive the inverted level signal output by the first state interlocking unit and output a level signal having the same phase; and a second state interlocking unit, which is configured to receive the level signals output from the second signal non-inverting input unit and the second signal inverting input unit, maintain states of the level signals unchanged through an interlocking structure, and output the level signals in forms of a non-inverted second level signal and an inverted second level signal, respectively.

In the level state transferring unit, the first signal non-inverting input unit comprises: a first TFT and a second TFT, both a source of the first TFT and a source of the second TFT are connected to a first voltage, a drain of the first TFT is connected to a gate of the second TFT, and a gate of the first TFT is connected to the first level non-inverting input terminal;

the first signal inverting input unit comprises; a third TFT and a fourth TFT, both a source of the third TFT and a source of the fourth TFT are connected to the first voltage, a drain of the third TFT is connected to a gate of the fourth TFT, and a gate of the third TFT is connected to the first level inverting input terminal; and the first state interlocking unit comprises: a fifth TFT and a sixth TFT, a gate of the fifth TFT is connected to a drain of the fourth TFT, a source of the fifth TFT is connected to a drain of the second TFT, a gate of the sixth TFT is connected to the drain of the second TFT, a source of the sixth TFT is connected to the drain of the fourth TFT, and both a drain of the fifth TFT and a drain of the sixth TFT are connected to a negative voltage.

In the second level driving unit, the second signal non-inverting input unit comprises: a seventh TFT and an eighth TFT, a gate of the seventh TFT is connected to the drain of the second TFT, a drain of the seventh TFT is connected to a gate of the eighth TFT, both a source of the seventh TFT and a source of the eighth TFT are connected to a second voltage, and a drain of the eighth TFT is connected to the second level non-inverting output terminal;

the second signal inverting input unit comprises: a ninth TFT and a tenth TFT, a gate of the ninth TFT is connected to the drain of the fourth TFT, a drain of the ninth TFT is connected to a gate of the tenth TFT, both a source of the ninth TFT and a source of the tenth TFT are connected to the second voltage, and a drain of the tenth TFT is connected to the second level inverting output terminal; and the second state interlocking unit comprises: an eleventh TFT and a twelfth TFT, a gate of the eleventh TFT is connected to the drain of the tenth TFT, a source of the eleventh TFT is connected to the drain of the eighth TFT, a gate of the twelfth TFT is connected to the drain of the eighth TFT, a source of the twelfth TFT is connected to the drain of the tenth TFT, and both a drain of the eleventh TFT and a drain of the twelfth TFT are connected to the negative voltage.

In the level state transferring unit, the first signal non-inverting input unit comprises: a first PTFT, a drain of the first PTFT is connected to a first voltage, and a gate of the first PTFT is connected to the first level non-inverting input terminal;

the first signal inverting input unit comprises: a second PTFT, a drain of the second PTFT is connected to the first voltage, and a gate of the second PTFT is connected to the first level inverting input terminal; and the first state interlocking unit comprises: a first NTFT and a second NTFT, a gate of the first NTFT is connected to a source of the second PTFT, a source of the first NTFT is connected to a source of the first PTFT, a gate of the second NTFT is connected to the source of the first PTFT, a source of the second NTFT is connected to the source of the second PTFT, and both a drain of the first NTFT and a drain of the second NTFT are connected to a negative voltage.

In the second level driving unit, the second signal non-inverting input unit comprises: a fourth NTFT, a gate of the fourth NTFT is connected to the source of the first PTFT, a source of the fourth NTFT is connected to the second level non-inverting output terminal, and a drain of the fourth NTFT is connected to a negative voltage;

the second signal inverting input unit comprises: a third NTFT, a gate of the third NTFT is connected to the source of the second PTFT, a source of the third NTFT is connected to the second level inverting output terminal, and a drain of the third NTFT is connected to a negative voltage; and the second state interlocking unit comprises: a third PTFT and a fourth PTFT, a gate of the third PTFT is connected to the source of the fourth NTFT, a source of the third PTFT is connected to the source of the third NTFT, a gate of the fourth PTFT is connected to the source of the third NTFT, a source of the fourth PTFT is connected to the source of the fourth NTFT, and both a drain of the third PTFT and a drain of the fourth PTFT are connected to a second voltage.

Preferably, the first level is lower than the second level.

The present invention further provides an array substrate, which comprises any one of the above level shift circuits.

The present invention further provides a display device, which comprises the above array substrate.

3. Beneficial Effects

In the embodiments of the present invention, by using TFTs to form the level shift circuit, the level shift circuit can be integrated onto an array substrate, which can not only avoid the problem of increased design cost caused by integrating a level shift circuit in a source driving chip, but can also solve the problem that the GOA unit cannot be started at a low temperature due to relatively low value of |VGH|+|VGL| resulting from IC manufacturing process in a solution of integrating a level shift circuit in a source driving chip.

DETAILED DESCRIPTION OF THE EMBODIMENTS

A level shift circuit in the present invention is formed by TFTs. By adopting the TFTs to manufacture the level shift circuit on an array substrate, and manufacturing the level shift circuit according to specific demands (for example, whether process condition of the array substrate is N-doped or P-doped, whether a GOA unit is located at a proximal end or a distal end of the panel, etc.) by a panel manufacturer, the problem of increased design cost due to a high voltage manufacturing process adopted for a source driving chip can be solved.

Figure 4:
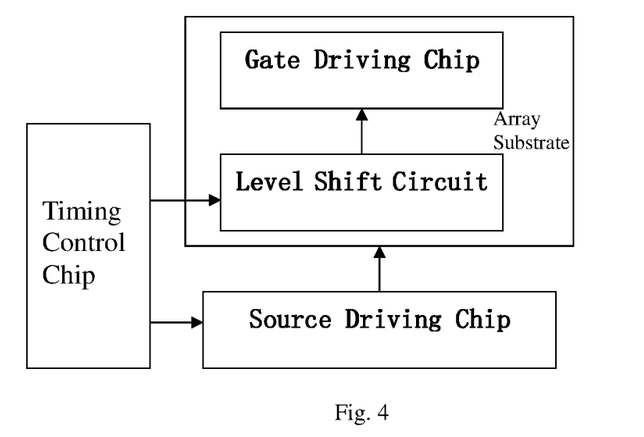
FIG. 4 is a schematic diagram of a driving structure of a GOA panel of an embodiment of the present invention, in which a gate driving chip and a level shift circuit are provided on an array substrate of a display panel.

FIG. 4 is a diagram of a driving structure of a GOA panel of the present invention, and in the driving structure, a level shift module in the prior art is integrated on an array substrate of a display panel in a form of TFT circuit. In the present invention, when a timing control (T-CON) chip outputs a low-voltage logical timing signal to the GOA (Gate On Array) panel, the low-voltage logical timing signal output by the T-CON is firstly converted into a high-voltage timing signal with the same phase by the level shift circuit integrated on the array substrate and formed by TFTs to be switched into, and then the high-voltage timing signal with the same phase is supplied to the GOA panel, so as to be used by a gate driving circuit to control ON and OFF states of the TFT in each pixel circuit. Therefore, a low voltage manufacturing process can surely be adopted for the T-CON chip, and thus system design cost is decreased. Meanwhile, since a gate control signal provided to the GOA panel from the T-CON changes from a high voltage in the prior art to a low voltage, the corresponding timing signal has reduced swing, and EMI (Electromagnetic Interference) noise is also reduced.

A level shift circuit provided by an embodiment of the present invention comprises: a first level non-inverting input terminal, a first level inverting input terminal, a second level non-inverting output terminal, a second level inverting output terminal, a level state transferring unit and a second level driving unit. The level state transferring unit receives a first level input through the first level non-inverting input terminal and the first level inverting input terminal, and transfers a state (i.e., high level or low level) of the input first level to the second level driving unit; the second level driving unit outputs a second level of a corresponding state to the second level non-inverting output terminal and the second level inverting output terminal according to the input state (i.e., high level or low level) of the first level, wherein the first level is not equal to the second level.

The level state transferring unit comprises:

a first signal non-inverting input unit, which is configured to receive a non-inverted level signal input through the first level non-inverting input terminal and output a level signal having the same phase;

a first signal inverting input unit, which is configured to receive an inverted level signal input through the first level inverting input terminal and output a level signal having the same phase; and a first state interlocking unit, which is configured to receive the level signals output by the first signal non-inverting input unit and the first signal inverting input unit, respectively, maintain states of the level signals unchanged through an interlocking structure, and output the level signals in forms of a non-inverted level signal and an inverted level signal, respectively.

The second level driving unit comprises:

a second signal non-inverting input unit, which is configured to receive the non-inverted level signal output by the first state interlocking unit and output a level signal having the same phase;

a second signal inverting input unit, which is configured to receive the inverted level signal output by the first state interlocking unit and output a level signal having the same phase; and a second state interlocking unit, which is configured to receive the level signals output from the second signal non-inverting input unit and the second signal inverting input unit, respectively, maintain states of the level signals unchanged through an interlocking structure, and output the level signals in forms of a non-inverted second level signal and an inverted second level signal, respectively.

Since the level shift module is generally used for raising a level, the second level (i.e., output level) is generally higher than the first level (i.e., input level).

The present invention is further described in detail below in conjunction with the accompanying drawings and specific embodiments. It should be understood that the following embodiments are merely used as examples for describing the present invention, rather than limiting the present invention.

Embodiment 1

Figure 5:
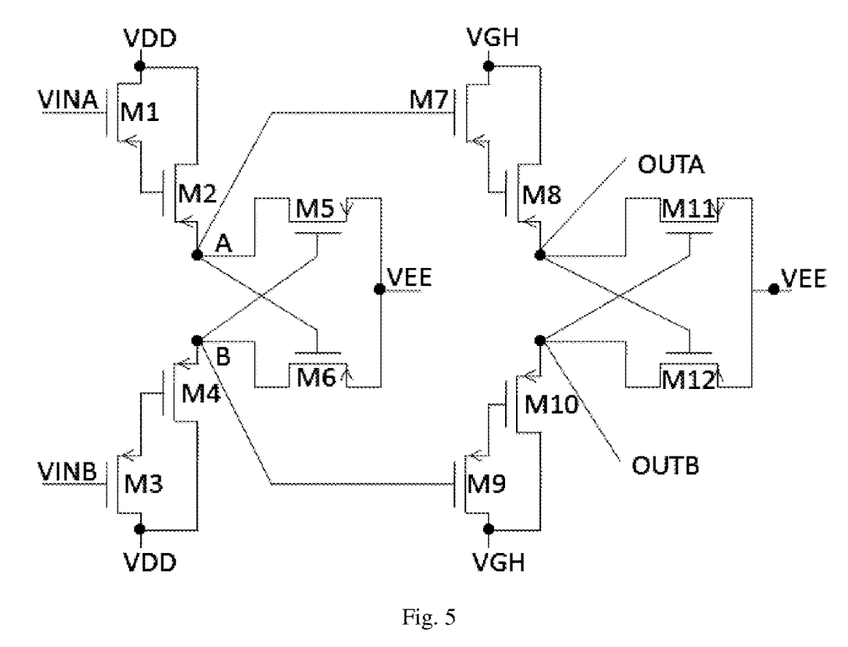
FIG. 5 is a schematic diagram of a structure of a level shift circuit of Embodiment 1 of the present invention.

A specific circuit structure of the present embodiment is as shown in FIG. 5, VINA is the first level non-inverting input terminal used for inputting a non-inverted level therethrough, and VINB is the first level inverting input terminal used for inputting an inverted level therethrough. OUTA is the second level non-inverting output terminal used for outputting a second non-inverted level, and OUTB is the second level inverting output terminal used for outputting a second inverted level. VDD is a first voltage, VGH is a second voltage and VEE is a negative voltage.

The level state transferring unit of the present embodiment has a structure as follows.

The first signal non-inverting input unit comprises: a first TFT M1 and a second TFT M2. Both a source of the first TFT M1 and a source of the second TFT M2 are connected to the first voltage VDD, a drain of the first TFT M1 is connected to a gate of the second TFT M2, and a gate of the first TFT M1 is connected to the first level non-inverting input terminal VINA.

The first signal inverting input unit comprises: a third TFT M3 and a fourth TFT M4. Both a source of the third TFT M3 and a source of the fourth TFT M4 are connected to the first voltage VDD, a drain of the third TFT M3 is connected to a gate of the fourth TFT M4, and a gate of the third TFT M3 is connected to the first level inverting input terminal VINB.

The first state interlocking unit comprises: a fifth TFT M5 and a sixth TFT M6, a gate of the fifth TFT M5 is connected to a drain of the fourth TFT M4, a source of the fifth TFT M5 is connected to a drain of the second TFT M2, a gate of the sixth TFT M6 is connected to the drain of the second TFT M2, a source of the sixth TFT M6 is connected to the drain of the fourth TFT M4, and both a drain of the fifth TFT M5 and a drain of the sixth TFT M6 are connected to the negative voltage VEE.

In the level state transferring unit, the gate of the first TFT M1 may serve as the first level non-inverting input terminal VINA, and the drain of the second TFT M2 may serve as the first level non-inverting output terminal, so as to transfer a state (i.e., high level or low level) of the level input through the first level non-inverting input terminal VINA to the second level driving unit. The gate of the third TFT M3 may serve as the first level inverting input terminal VINB, and the drain of the fourth TFT M4 may serve as the first level inverting output terminal, so as to transfer a state of the level input through the first level inverting input terminal VINB to the second level driving unit. The first state interlocking unit formed by the fifth TFT M5 and the sixth TFT M6 is used for maintaining states of levels output by the first level non-inverting output terminal (Point A in FIG. 5) and the first level inverting output terminal (Point B in FIG. 5).

The second level driving unit of the present embodiment has a structure as follows.

The second signal non-inverting input unit comprises: a seventh TFT M7 and an eighth TFT M8. A gate of the seventh TFT M7 is connected to the drain of the second TFT M2, a drain of the seventh TFT M7 is connected to a gate of the eighth TFT M8, both a source of the seventh TFT M7 and a source of the eighth TFT M8 are connected to the second voltage VGH, and a drain of the eighth TFT M8 is connected to the second level non-inverting output terminal OUTA.

The second signal inverting input unit comprises: a ninth TFT M9 and a tenth TFT M10. A gate of the ninth TFT M9 is connected to the drain of the fourth TFT M4, a drain of the ninth TFT M9 is connected to a gate of the tenth TFT M10, both a source of the ninth TFT M9 and a source of the tenth TFT M10 are connected to the second voltage VGH, and a drain of the tenth TFT M10 is connected to the second level inverting output terminal OUTB.

The second state interlocking unit comprises: an eleventh TFT M11 and a twelfth TFT M12. A gate of the eleventh TFT M11 is connected to the drain of the tenth TFT M10, a source of the eleventh TFT M11 is connected to the drain of the eighth TFT M8, a gate of the twelfth TFT M12 is connected to the drain of the eighth TFT M8, a source of the twelfth TFT M12 is connected to the drain of the tenth TFT M10, and both a drain of the eleventh TFT M11 and a drain of the twelfth TFT M12 are connected to the negative voltage VEE.

In the second level driving unit, the gate of the seventh TFT M7 may serve as a receiving terminal for receiving the level transferred from the first level non-inverting output terminal (Point A in FIG. 5), the gate of the ninth TFT M9 may serve as a receiving terminal for receiving the level transferred from the first level inverting output terminal (Point B in FIG. 5), and the drain of the tenth TFT M10 may serve as the second level inverting output terminal OUTB. The second state interlocking unit formed by the eleventh TFT M11 and the twelfth TFT M12 is used for maintaining states of levels output by the second level non-inverting output terminal and the second level inverting output terminal.

The specific working principle of the circuit is as follows.

Figure 7:
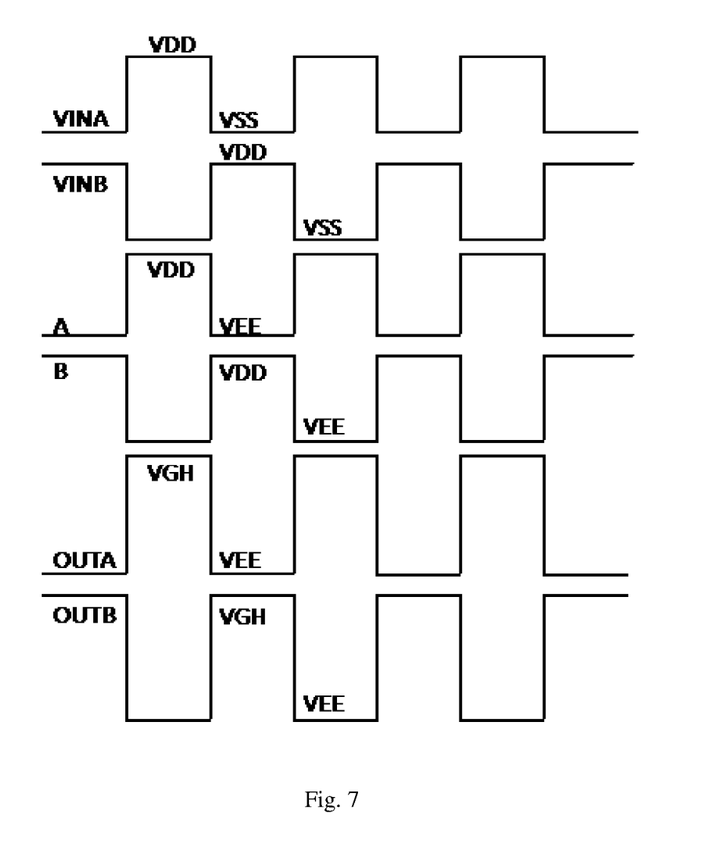
FIG. 7 is a schematic diagram illustrating level shifting states in an embodiment of the present invention.

Level shifting states of the level shift circuit of the present embodiment are as shown in FIG. 7. Specifically, signals with opposite phases are input into the first level non-inverting input terminal VINA and the first level inverting input terminal VINB, respectively, when the first level non-inverting input terminal VINA is at a high level, the first level inverting input terminal VINB is at a low level, the first TFT M1 and the second TFT M2 are turned on, the third TFT M3 and the fourth TFT M4 are turned off, at this point, Point A is at a high level, the sixth TFT M6 is turned on, Point B is at a low level, and the fifth TFT T5 is turned off, so that Point A remains at a high level. Since Point A is at a high level, the seventh TFT M7 and the eighth TFT M8 are turned on, the second level non-inverting output terminal OUTA is at a high level, the twelfth TFT M12 is turned on, the second level inverting output terminal OUTB is at a low level, and the eleventh TFT M11 is turned off, so that the second level non-inverting output terminal OUTA remains at a high level. On the contrary, when the first level non-inverting input terminal VINA is at a low level, the first level inverting input terminal VINB is at a high level, the third TFT M3 and the fourth TFT M4 are turned on, Point B is at a high level, the fifth TFT M5 is turned on, thus, Point A is at a low point, the sixth TFT M6 is turned off, so that Point B remains at a high level; since Point B is at a high level, the ninth TFT M9 and the tenth TFT M10 are turned on, the second level inverting output terminal OUTB is at a high level, the eleventh TFT M11 is turned on, thus, the second level non-inverting output terminal OUTA is at a low level, the twelfth TFT M12 is turned off, and the second level inverting output terminal OUTB remains at a high level.

In the present embodiment, by using the TFTs to form the level shift circuit, the level shift circuit can be integrated onto an array substrate, which can not only avoid the problem of increased design cost caused by integrating a level shift circuit in a source driving chip, but can also solve the problem that the GOA unit cannot be started at a low temperature due to relatively low value of |VGH|+|VGL| resulting from IC manufacturing process in a solution of integrating a level shift circuit in a source driving chip.

Moreover, since a low voltage (below 6V) manufacturing process is adopted for interior of the source driving chip, while a high voltage (30V or 32V) manufacturing process is adopted for the gate driving circuit, it is also necessary for the source driving chip with a built-in level shift circuit and including a timing circuit for the gate driving circuit to adopt a high voltage (30V or 32V) manufacturing process. In the present embodiment, by providing the level shift circuit on an array substrate, a low voltage (below 6V) manufacturing process can be adopted for the source driving chip.

Embodiment 2

Figure 6:
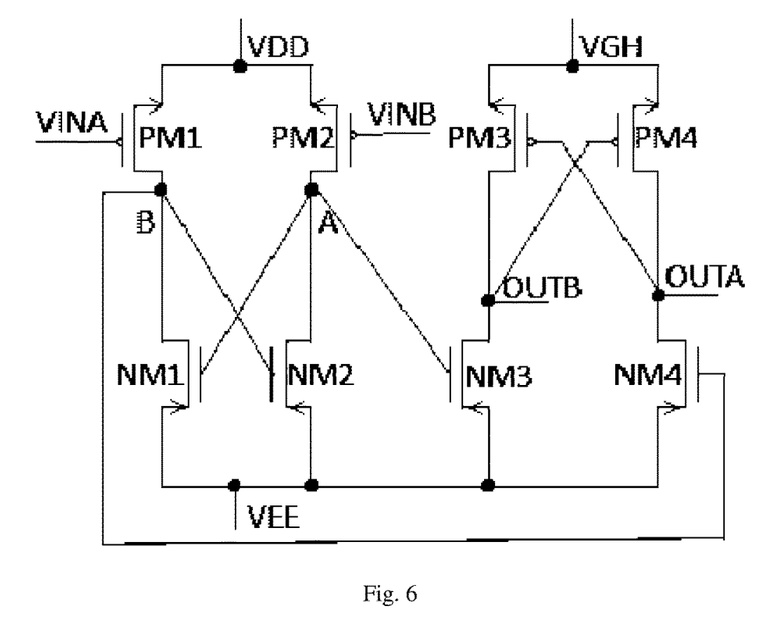
FIG. 6 is a schematic diagram of a structure of a level shift circuit of Embodiment 2 of the present invention.

A specific circuit structure of the present embodiment is as shown in FIG. 6, VINA is the first level non-inverting input terminal used for inputting a non-inverted level therethrough, and VINB is the first level inverting input terminal used for inputting an inverted level therethrough. OUTA is the second level non-inverting output terminal used for outputting a second non-inverted level, and OUTB is the second level inverting output terminal used for outputting a second inverted level. VDD is a first voltage, VGH is a second voltage and VEE is a negative voltage. For simplicity of description, in the description of the present invention, PTFT denotes a P-channel TFT, and NTFT denotes an N-channel TFT.

The level state transferring unit of the present embodiment has a structure as follows.

The first signal non-inverting input unit comprises: a first PTFT PM1, a drain of the first PTFT PM1 is connected to the first voltage VDD, and a gate of the first PTFT PM1 is connected to the first level non-inverting input terminal VINA.

The first signal inverting input unit comprises: a second PTFT PM2, a drain of the second PTFT PM2 is connected to the first voltage VDD, and a gate of the second PTFT PM2 is connected to the first level inverting input terminal VINB.

The first state interlocking unit comprises: a first NTFT NM1 and a second NTFT NM2, a gate of the first NTFT NM1 is connected to a source of the second PTFT PM2, a source of the first NTFT NM1 is connected to a source of the first PTFT PM1, a gate of the second NTFT NM2 is connected to the source of the first PTFT PM1, a source of the second NTFT NM2 is connected to the source of the second PTFT PM2, and both a drain of the first NTFT NM1 and a drain of the second NTFT NM2 are connected to the negative voltage VEE.

In the level state transferring unit, the gate of the first PTFT PM1 may serve as the first level non-inverting input terminal VINA, and the source thereof may serve as the first level non-inverting output terminal (Point B in FIG. 6), so as to transfer a state (i.e., high level or low level) of the level input through the first level non-inverting input terminal VINA to the second level driving unit. The gate of the second PTFT PM2 may serve as the first level inverting input terminal VINB, and the source thereof may serve as the first level inverting output terminal (Point A in FIG. 6), so as to transfer a state (i.e., high level or low level) of the level input through the first level inverting input terminal VINB to the second level driving unit. The first state interlocking unit formed by the first NTFT NM1 and the second NTFT NM2 is used for maintaining states of levels output by the first level non-inverting output terminal (Point B in FIG. 6) and the first level inverting output terminal (Point A in FIG. 6).

The second level driving unit of the present embodiment has a structure as follows.

The second signal non-inverting input unit comprises: a fourth NTFT NM4, a gate of the fourth NTFT NM4 is connected to the source of the first PTFT PM1, a source of the fourth NTFT NM4 is connected to the second level non-inverting output terminal OUTA, and a drain of the fourth NTFT NM4 is connected to the negative voltage VEE.

The second signal inverting input unit comprises: a third NTFT NM3, a gate of the third NTFT NM3 is connected to the source of the second PTFT PM2, a source of the third NTFT NM3 is connected to the second level inverting output terminal OUTB, and a drain of the third NTFT is connected to the negative voltage VEE.

The second state interlocking unit comprises: a third PTFT PM3 and a fourth PTFT PM4, a gate of the third PTFT PM3 is connected to the source of the fourth NTFT NM4, a source of the third PTFT PM3 is connected to the source of the third NTFT NM3, a gate of the fourth PTFT PM4 is connected to the source of the third NTFT NM3, a source of the fourth PTFT PM4 is connected to the source of the fourth NTFT NM4, and both a drain of the third PTFT PM3 and a drain of the fourth PTFT PM4 are connected to the second voltage VGH.

In the second level driving unit, the gate of the fourth NTFT NM4 may serve as a receiving terminal for receiving the level transferred from the first level non-inverting output terminal (Point B in FIG. 6), and the source thereof may serve as the second level non-inverting output terminal OUTA. The gate of the third NTFT NM3 may serve as a receiving terminal for receiving the level transferred from the first level inverting output terminal (Point A in FIG. 6), and the source thereof may serve as the second level inverting output terminal OUTB. The second state interlocking unit formed by the third PTFT PM3 and the fourth PTFT PM4 is used for maintaining states of levels output by the second level non-inverting output terminal and the second level inverting output terminal.

The working principle of the present embodiment is similar to that in the above embodiment, and level shifting states of the level shift circuit of the present embodiment are also as shown in FIG. 7. Specifically, when the first level non-inverting input terminal VINA is at a low level, the first level inverting input terminal VINB is at a high level, the first PTFT PM1 is turned on, Point B is at a high level, the second NTFT NM2 is turned on, Point A is at a low level, the first NTFT NM1 is turned off, and Point B remains at a high level; the fourth NTFT NM4 is turned on, the second level non-inverting output terminal OUTA is at a low level, the third PTFT PM3 is turned on, the second level inverting output terminal OUTB is at a high level, the fourth PTFT PM4 is turned off, and the second level non-inverting output terminal OUTA remains at a low level. When the first level non-inverting input terminal VINA is at a high level, the first level inverting input terminal VINB is at a low level, the second PTFT PM2 is turned on, Point A is at a high level, the first NTFT NM1 is turned on, Point B is at a low point, the second NTFT NM2 is turned off, and Point A remains at a high level; the third NTFT NM3 is turned on, the second level inverting output terminal OUTB is at a low level, the fourth PTFT PM4 is turned on, the second level non-inverting output terminal OUTA is at a high level, the third PTFT PM3 is turned off, and the second level inverting output terminal OUTB remains at a low level.

The present embodiment can achieve the same technical effects as Embodiment 1, which are not elaborated herein.

The level shift circuit of the present invention may also works with a timing control chip to eliminate shutdown afterimage. When the timing control chip detects that a level of system power is lower than a certain value, the level output to the first level non-inverting input terminal VINA of the GOA unit is pulled up, so that the second level non-inverting output terminal OUTA remains at a high level. Combined with an afterimage eliminating design with an electrostatic ring for the GOA array substrate, the shutdown afterimage can be eliminated.

The present invention further provides an array substrate comprising the level shift circuit in Embodiment 1 or 2.

The present invention further provides a display device comprising the above array substrate. The display device may be any product or component with a display function, such as a liquid crystal panel, an electronic paper, an OLED panel, a mobile phone, a tablet computer, a television, a display, a notebook computer, a digital photo frame, a navigator or the like.

The above implementations are merely used for explaining the present invention, rather than limiting the present invention. For those skilled in the art, various variations and modifications may be made without departing from the spirit and scope of the present invention, therefore, all equivalent technical solutions thereof also fall into the protection scope of the present invention, which should be defined by the appended claims.

The invention claimed is:

1. A level shift circuit, comprising: a first level non-inverting input terminal, a first level inverting input terminal, a second level non-inverting output terminal, a second level inverting output terminal, a level state transferring unit and a second level driving unit; wherein,
the level state transferring unit receives a first level input through the first level non-inverting input terminal and the first level inverting input terminal, and transfers a state of the input first level to the second level driving unit; the second level driving unit outputs a second level of a corresponding state to the second level non-inverting output terminal and the second level inverting output terminal according to the input state of the first level, and the first level is not equal to the second level, wherein,
the level state transferring unit comprises:
a first signal non-inverting input unit, which is configured to receive a non-inverted level signal input through the first level non-inverting input terminal and output a level signal having the same phase;
a first signal inverting input unit, which is configured to receive an inverted level signal input through the first level inverting input terminal and output a level signal having the same phase; and
a first state interlocking unit, which is configured to receive the level signals output from the first signal non-inverting input unit and the first signal inverting input unit, maintain states of the level signals unchanged through an interlocking structure, and output the level signals in forms of a non-inverted level signal and an inverted level signal, respectively.

2. The level shift circuit according to claim 1, wherein, the second level driving unit comprises:
a second signal non-inverting input unit, which is configured to receive the non-inverted level signal output by the first state interlocking unit and output a level signal having the same phase;
a second signal inverting input unit, which is configured to receive the inverted level signal output by the first state interlocking unit and output a level signal having the same phase; and
a second state interlocking unit, which is configured to receive the level signals output from the second signal non-inverting input unit and the second signal inverting input unit, maintain states of the level signals unchanged through an interlocking structure, and output the level signals in forms of a non-inverted second level signal and an inverted second level signal, respectively.

3. The level shift circuit according to claim 2, wherein, the first signal non-inverting input unit comprises: a first TFT and a second TFT, both a source of the first TFT and a source of the second TFT are connected to a first voltage, a drain of the first TFT is connected to a gate of the second TFT, and a gate of the first TFT is connected to the first level non-inverting input terminal;
the first signal inverting input unit comprises; a third TFT and a fourth TFT, both a source of the third TFT and a source of the fourth TFT are connected to the first voltage, a drain of the third TFT is connected to a gate of the fourth TFT, and a gate of the third TFT is connected to the first level inverting input terminal; and
the first state interlocking unit comprises: a fifth TFT and a sixth TFT, a gate of the fifth TFT is connected to a drain of the fourth TFT, a source of the fifth TFT is connected to a drain of the second TFT, a gate of the sixth TFT is connected to the drain of the second TFT, a source of the sixth TFT is connected to the drain of the fourth TFT, and both a drain of the fifth TFT and a drain of the sixth TFT are connected to a negative voltage.

4. The level shift circuit according to claim 3, wherein, the second signal non-inverting input unit comprises: a seventh TFT and an eighth TFT, a gate of the seventh TFT is connected to the drain of the second TFT, a drain of the seventh TFT is connected to a gate of the eighth TFT, both a source of the seventh TFT and a source of the eighth TFT are connected to a second voltage, and a drain of the eighth TFT is connected to the second level non-inverting output terminal;
the second signal inverting input unit comprises: a ninth TFT and a tenth TFT, a gate of the ninth TFT is connected to the drain of the fourth TFT, a drain of the ninth TFT is connected to a gate of the tenth TFT, both a source of the ninth TFT and a source of the tenth TFT are connected to the second voltage, and a drain of the tenth TFT is connected to the second level inverting output terminal; and
the second state interlocking unit comprises: an eleventh TFT and a twelfth TFT, a gate of the eleventh TFT is connected to the drain of the tenth TFT, a source of the eleventh TFT is connected to the drain of the eighth TFT, a gate of the twelfth TFT is connected to the drain of the eighth TFT, a source of the twelfth TFT is connected to the drain of the tenth TFT, and both a drain of the eleventh TFT and a drain of the twelfth TFT are connected to the negative voltage.

5. The level shift circuit according to claim 4, wherein, the first level is lower than the second level.

6. The level shift circuit according to claim 3, wherein, the first level is lower than the second level.

7. The level shift circuit according to claim 2, wherein, the first signal non-inverting input unit comprises: a first PTFT, a drain of the first PTFT is connected to a first voltage, and a gate of the first PTFT is connected to the first level non-inverting input terminal;
the first signal inverting input unit comprises: a second PTFT, a drain of the second PTFT is connected to the first voltage, and a gate of the second PTFT is connected to the first level inverting input terminal; and
the first state interlocking unit comprises: a first NTFT and a second NTFT, a gate of the first NTFT is connected to a source of the second PTFT, a source of the first NTFT is connected to a source of the first PTFT, a gate of the second NTFT is connected to the source of the first PTFT, a source of the second NTFT is connected to the source of the second PTFT, and both a drain of the first NTFT and a drain of the second NTFT are connected to a negative voltage.

8. The level shift circuit according to claim 7, wherein, the second signal non-inverting input unit comprises: a fourth NTFT, a gate of the fourth NTFT is connected to the source of the first PTFT, a source of the fourth NTFT is connected to the second level non-inverting output terminal, and a drain of the fourth NTFT is connected to the negative voltage;
the second signal inverting input unit comprises: a third NTFT, a gate of the third NTFT is connected to the source of the second PTFT, a source of the third NTFT is connected to the second level inverting output terminal, and a drain of the third NTFT is connected to the negative voltage; and
the second state interlocking unit comprises: a third PTFT and a fourth PTFT, a gate of the third PTFT is connected to the source of the fourth NTFT, a source of the third PTFT is connected to the source of the third NTFT, a gate of the fourth PTFT is connected to the source of the third NTFT, a source of the fourth PTFT is connected to the source of the fourth NTFT, and both a drain of the third PTFT and a drain of the fourth PTFT are connected to a second voltage.

9. The level shift circuit according to claim 8, wherein, the first level is lower than the second level.

10. The level shift circuit according to claim 7, wherein, the first level is lower than the second level.

11. The level shift circuit according to claim 2, wherein, the first level is lower than the second level.

12. The level shift circuit according to claim 1, wherein, the first level is lower than the second level.

13. An array substrate, comprising the level shift circuit according to claim 1.

14. A display device, comprising the array substrate according to claim 13.

* * * * *